United States Patent
Takahashi

(10) Patent No.: US 6,939,779 B2
(45) Date of Patent: Sep. 6, 2005

(54) METHOD OF MANUFACTURING SEMICONDUCTOR DEVICE

(75) Inventor: Masashi Takahashi, Chiba (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/458,187

(22) Filed: Jun. 11, 2003

(65) Prior Publication Data

US 2004/0142538 A1 Jul. 22, 2004

(30) Foreign Application Priority Data

Nov. 20, 2002 (JP) ..................................... P2002-335872

(51) Int. Cl.$^7$ ............................................ H01L 21/76
(52) U.S. Cl. ..................................... 438/426; 438/433
(58) Field of Search ................................ 438/296, 404, 438/424, 426, 433, 766

(56) References Cited

U.S. PATENT DOCUMENTS

| | | | | |
|---|---|---|---|---|
| 6,258,676 B1 | * | 7/2001 | Lee et al. ................. | 438/296 |
| 6,323,092 B1 | * | 11/2001 | Lee .......................... | 438/296 |
| 6,437,417 B1 | * | 8/2002 | Gilton ...................... | 257/506 |
| 6,482,704 B1 | * | 11/2002 | Amano et al. ............ | 438/285 |
| 6,518,635 B1 | * | 2/2003 | Shiozawa et al. ........ | 257/410 |
| 2002/0182826 A1 | * | 12/2002 | Cheng et al. ............. | 438/433 |

FOREIGN PATENT DOCUMENTS

| | | |
|---|---|---|
| JP | 10-270546 | 10/1998 |
| JP | 11-186378 | 7/1999 |
| JP | 2000-306991 | 11/2000 |

* cited by examiner

*Primary Examiner*—Amir Zarabian
*Assistant Examiner*—Pamela E Perkins
(74) *Attorney, Agent, or Firm*—Wenderoth, Lind & Ponack, L.L.P.

(57) ABSTRACT

On a substrate (1), a silicon oxide film (2) is formed. Thereon, a silicon nitride film (3) is formed. And, an opening for a trench is formed by patterning these films. Then, an oxide film including fluorine (8) is formed on the substrate (1). A fluorine diffusing layer (9) is formed by diffusing fluorine from the oxide film including fluorine (8) with its width wider than the opening for a trench. Then a trench (4) is formed, leaving fluorine diffusing layer portions (9a). After this, a thermal oxide film is formed on the inner wall of trench (4). Then the thermal oxide film includes fluorine near the corner of trench (4). This is diffused from the fluorine diffusing layer portions (9a). After all this, the trench (4) is filled with oxide film (6).

14 Claims, 4 Drawing Sheets

PRIOR ART

METHOD OF MANUFACTURING SEMICONDUCTOR DEVICE

BACKGROUND OF THE INVENTION

1. Field of the Invention

The present invention relates to a method of manufacturing a semiconductor device for forming isolation regions of semiconductor elements, which is formed on a semiconductor substrate, in order to isolate elements by an insulator. And, it especially relates to a method to effectively relieve enhancement of an electric field at a corner portion of a trench filled with an insulator.

2. Description of the Related Art

Generally, an isolation region is needed to be made, first of all, in order to insulate each element, when plural elements are going to be formed on a semiconductor substrate. This kind of isolation region is made by the method, for example, shown in FIG. 6.

At first, as shown in FIG. 6(a), a mask for forming a trench is formed. This mask is formed by etching a silicon nitride film 3 and a silicon oxide film 2 in this order, with a photo-lithography technique, after forming the silicon oxide film 2 and silicon nitride film 3 in this order.

And, as shown in FIG. 6(b), a trench 4 is formed by etching substrate 1 with this mask.

After this, insulating material is going to be filled in this trench 4. However, before that, a corner portion A of trench 4 needs to be formed to a gentle R-shape. The reason is described briefly, as follows.

As shown in FIG. 3, plural elements, that is, MOS transistors 10,10 cross their common gate electrode 11 with these corner portions A. And, the electric field impressed to the gate electrode 11 is provided to an active region between source region 12 and drain region 13 (c.f. FIG. 4).

However, if these corner portions A are left sharp, then, the electric field impressed to the gate electrode 11 enhances at these sharp corner portions. Therefore, dielectric breakdown is likely to be caused by the concentration of electric field at corner portions A. And, the thinner the gate insulating film becomes, the more the necessity of relieving this electric field concentration increases. Moreover, parasitic transistors are caused by the concentration of electric field or thinning of gate insulating film, as well as a drop of reliability of the gate insulating film.

Therefore, as shown in FIG. 6(c), the trench corner portions A are formed to R-shape by forming thermal oxide film 5 with heat-oxidation. After this, as shown in FIG. 6(d), a silicon oxide film 6 is filled in the trench 4. And, the silicon nitride film 3 and the silicon oxide film 2 are removed. Then, a gate oxide film 7 is formed. In the meantime, to make gentle these trench corner portions A effectively, a method of forming a shallow and wide trench is adopted (c.f. JP 2000-306991).

Moreover, as another conventional art, there is a method of supplying silicon oxide film with fluorine only in the vicinity of trench corner portions A. This method is processed by implanting fluorine ions etc. in the trench corner portions A mentioned above, with a Tilt Ion Implantation technique (c.f. JP 10-270546, especially in page 4, FIG. 1).

Besides, there is another method of filling the trench with fluoride SiOF as well as forming silicon oxide film at trench corner portions A (c.f. JP 11-186378, especially in pages 7,8, FIGS. 1 to 5).

However, the conventional methods mentioned above have had the following problems.

First, as for the method of forming thermal oxide film, it had various disadvantages owing to the high temperature of thermal oxidation. To be concrete, a high temperature of 1000° C. to 1200° C. was needed. And, a film thickness of 30 nm to 60 nm was needed in order to make the corner portions gentle effectively. So, the thermal process at high temperature as mentioned above must be continued while the film of this thickness is formed. Moreover, high oxidation ability was needed as well as high temperature, because the rate of oxidation must be low. That is, wet oxidation is more preferable than dry oxidation. Further, radical oxidation etc. is still more preferable.

Therefore, in the manufacturing process, pollution in the furnace chamber, tube or boat are likely to occur. And, slips or wafer warp are likely to occur.

Moreover, an expensive and specific apparatus was necessary, because a function for retarding the oxidation rate at high temperature and a function for performing radical oxidation are needed. Therefore, a cost increase of the product was inevitable.

Second, there is a problem caused by high integration of elements. That is, the thickness of thermal oxidation film 5 must be made thinner, as the semiconductor elements become thinner, when using thermal oxidation film 5 for making the gentle corner portions A. Otherwise, a transforming difference, which occurs when transforming silicon into silicon oxide with thermal oxidation, becomes large compared with the size of the elements. However, an oxide film having a thickness of more than 30 nm as mentioned above is needed in order to make the corner portions sufficiently gentle. Therefore, it has become difficult to make them gentle.

Third, damage the substrate or pollution of the metal can be caused when an ion implantation technique. In order to avoid this, it is necessary to make the film thickness of the mask sufficiently thick when used for ion implantation. To be concrete, a thickness of more than 180 nm is needed at 30 keV of ion implantation acceleration.

Fourth, as for the method of filling fluoride all over the inside of the trench, it is difficult to fill the inside of the trench uniformly. So, cavities are likely to occur inside the trench. Moreover, a lot of fluorine is included in other portions than the trench corner portions A where the electric field concentrates. Such an amount of fluorine is likely to invade into active regions by heat-diffusion, when a gate oxide film etc. is formed. Because of this, the characteristic of elements is likely to deteriorate.

SUMMARY OF THE INVENTION

The present invention adopts the following configuration in order to solve the problems mentioned above.

As a first configuration, at first, performed are a process of forming a silicon oxide film on a substrate, a process of forming a silicon nitride film on the silicon oxide film, and a process of forming a trench opening by patterning the silicon nitride film and silicon oxide film so as to form an oxide film with fluorine on the substrate where the trench opening is formed.

And, performed are a process of forming a fluorine diffusion layer by diffusing fluorine with heat-diffusion from the oxide film with fluorine, and a process of removing the oxide film with fluorine so as to form a trench by using the silicon nitride film and silicon oxide film as a mask.

After these processes, performed are a process of forming thermal oxide film which includes fluorine atoms at corner portions, in a process of forming thermal oxide film on inner side walls of the trench, and filling oxide film in the trench, and a process of removing the silicon nitride film and silicon oxide film so as to make isolation regions of semiconductor elements.

As a second configuration, at first, performed are a process of forming a silicon oxide film on a substrate, a process of forming a silicon nitride film on the silicon oxide film, and a process of forming a trench opening by patterning the silicon nitride film and silicon oxide film so as to form oxide film including fluoride on the substrate where the trench opening is formed, and form side walls by etching the oxide film with fluorine.

And, performed is a process of forming a trench by using the side walls, the silicon nitride film and silicon oxide film as a mask.

After this process, performed are a process of forming thermal oxide film including fluorine atoms at corner portions in a process of forming thermal oxide film on the inner wall of the trench, and filling the trench with oxide film, and a process of removing the silicon nitride film and silicon oxide film; so as to make isolation region of semiconductor element.

Since the present invention adopts the method of forming oxide film including fluorine atoms only at the trench corner portions, the oxide film of trench corner portions can be made electrically thick without using expensive manufacturing apparatus. By this, the concentration of electric field at trench corner portions can be relieved. Besides, the occurrence of a surface state and the occurrence of positive hole trapping can be suppressed. Moreover, thermal oxide film formed on the inner side walls can be made thinner corresponding to thinner film of semiconductor elements. So, the difference of the position of the trench inner wall surface caused by the transformation from silicon to silicon oxide with heat-oxidation can be suppressed. By this, the progression of oxidation into active regions where minute elements are formed is suppressed. As a result, the reliability of gate insulating film can be increased and the yield of semiconductor elements can be kept at a high level. So, a device of high quality can be provided.

On the other hand, including fluorine atoms vainly all over the inside of the trench is avoided, because they can be included only at the trench corner portions A. By this, the threat of diffusing fluorine impurities into the transistor forming region has vanished. Thus, fluorine atoms can be included effectively only in the regions where the electric field concentration occurs.

DETAILED DESCRIPTION OF THE PREFERRED EMBODIMENTS

Figure 1A:
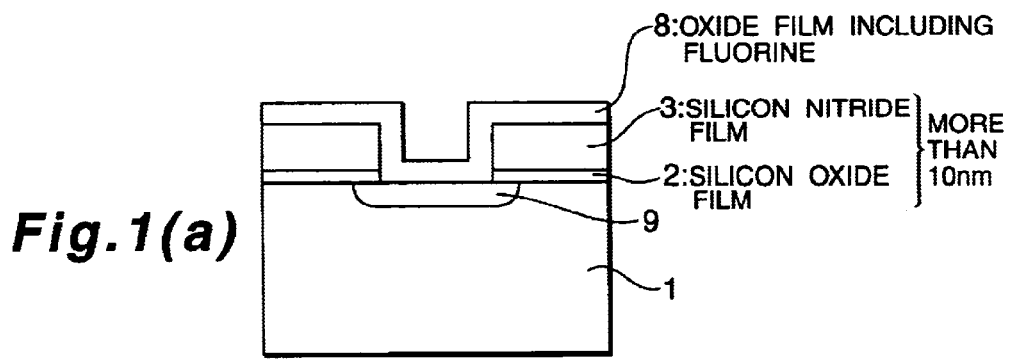
FIGS. 1(a)–(d) show Embodiment 1 of a manufacturing method according to present invention.

Hereafter, preferred embodiments of present invention are described referring to the drawings.

<Embodiment 1>

FIG. 1 shows principal manufacturing processes in a method for manufacturing an isolating region of a semiconductor element, especially an isolating layer with a trench.

In FIG. 1(a), at first, on a substrate 1, a silicon oxide film 2 is formed at 5 to 50 nm as a basement layer by CVD (Chemical Vapor Deposition) or heat-oxidation. And, thereon, a silicon nitride layer 3 is formed by CVD. After this, patterning is performed to this silicon nitride film 3 and the silicon oxide film 2 beneath it by photo-lithography and etching.

And, on the substrate patterned like this, an oxide film including fluorine 8 comprising SiOF is formed at 50 to 200 nm by plasma CVD. This can be performed, for example, by using high density plasma in an atmosphere of a mixture gas of SiH4, SiF4, 02 and Ar at a power of about 4 kW and a pressure of about 800 pa.

Next to this, an anneal is performed for 10 to 30 minutes at a temperature of 900 to 1000° C. By this, fluorine atoms are heat-diffused into region of substrate 1 where elements isolating region is formed, with the patterned silicon nitride film 3 as a diffusion mask. As a result, a fluorine diffusing layer 9 is formed. Incidentally, in the process, the active regions of substrate 1 where elements are formed in the future, are protected by the patterned silicon nitride film 3, which covers the active regions. So, the active regions are never polluted.

Figure 1B:
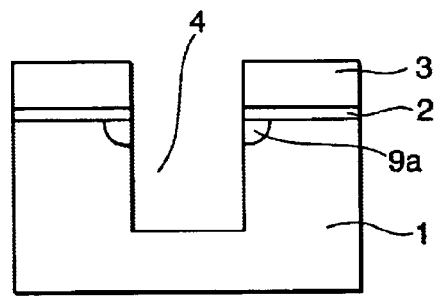

In FIG. 1(b), at first, the oxide film including fluorine 8 is removed with a solution of fluoric acid. And, a trench 4 is formed in the elements isolating region of substrate 1 by known etching, using silicon oxide film 2 and silicon nitride film 3 as a mask. On this occasion, almost all of fluorine diffusing region 9 is removed by etching. However, small parts of it remain as silicon layer portions containing fluorine 9a in the vicinity of end portions of the patterned silicon oxide film 2.

Figure 1C:
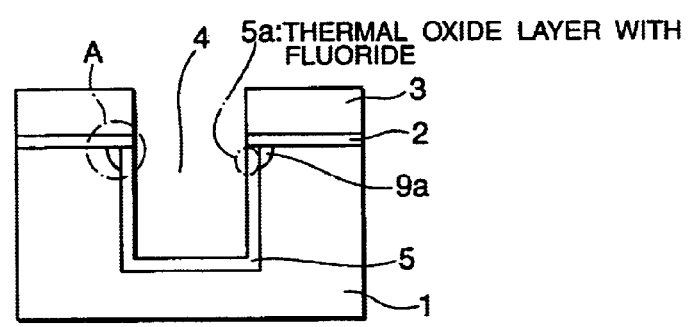

In FIG. 1(c), a thermal oxide film 5 of thickness of 5 to 15 nm is formed by performing heat-oxidation at a temperature of 900 to 1100° C. This is performed for gentling the corner portions A of trench 4. The thermal oxide film 5 formed in this way becomes an oxide layer portion including fluorine 5a at the portion in the vicinity of silicon layer portion including fluorine 9a. Incidentally, during this heat-oxidation, active regions of substrate 1 are protected from pollution by the silicon nitride film 3 being formed sufficiently thick.

Figure 1D:
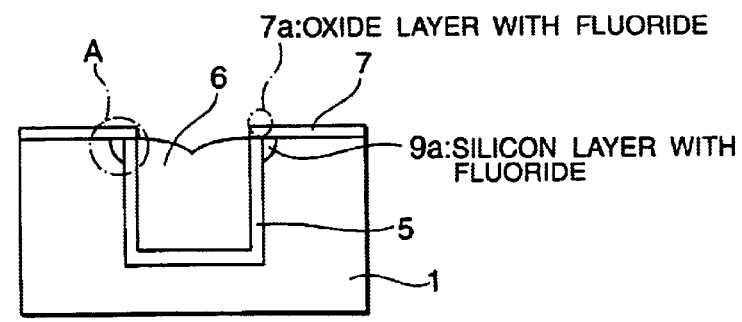
Figure 2:
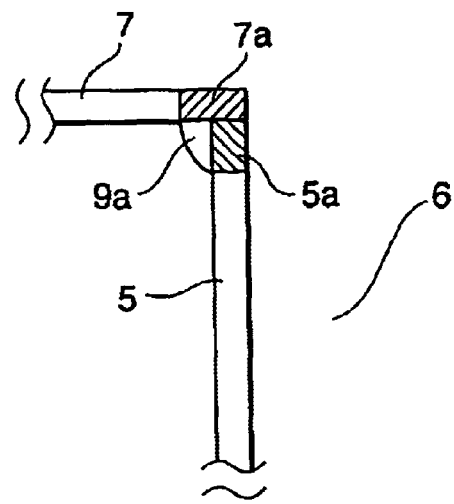
FIG. 2 shows a trench corner portion featuring the present invention.

In FIG. 1(d), an oxide film 6 is formed by CVD. And, it is filled in by CMP (Chemical Mechanical Polishing). After this, the silicon nitride film 3 and silicon oxide film 2 are removed.

After that, a gate oxide film 7 is formed by heat-oxidation. The gate oxide film 7 formed in this way becomes an oxide layer portion including fluorine 7a in the vicinity of the silicon layer portion including fluorine 9a, by diffusing fluorine atoms with heat-oxidation. Moreover, the gate oxide film 7 can be formed by CVD. The gate oxide film 7 formed in this way becomes an oxide layer portion including fluorine 7a by heat-diffusion of fluorine atoms with an annealing process.

As mentioned above, the silicon oxide film includes fluorine only in the vicinity of trench corner portions A.

Figure 3:
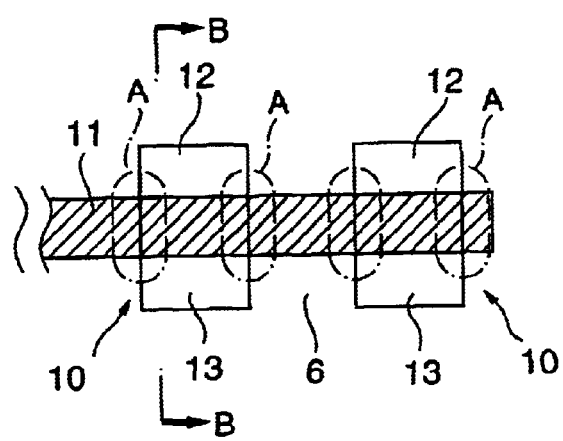
FIG. 3 shows a plan view of elements and their isolating region.
Figure 4:
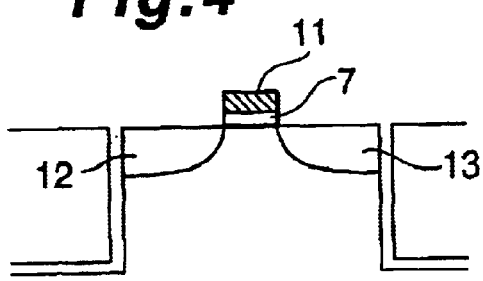
FIG. 4 shows configuration of an element.
Figure 5A:
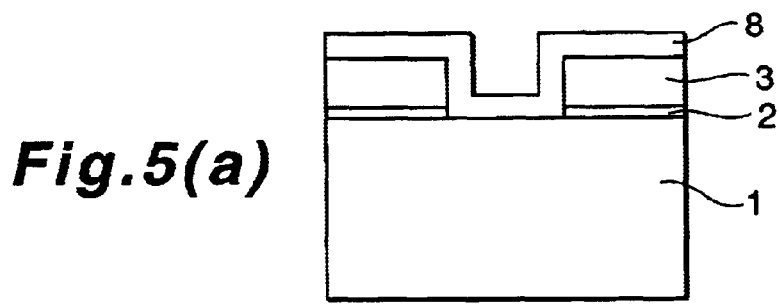
FIGS. 5(a)–(e) show Embodiment 2 of a manufacturing method according to present invention.
Figure 5B:
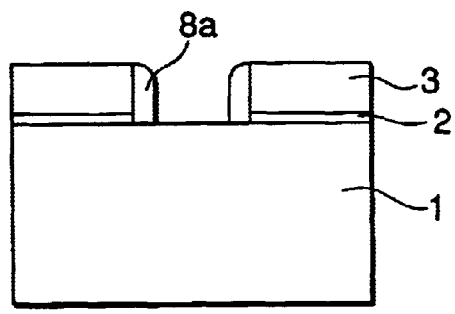
Figure 5C:
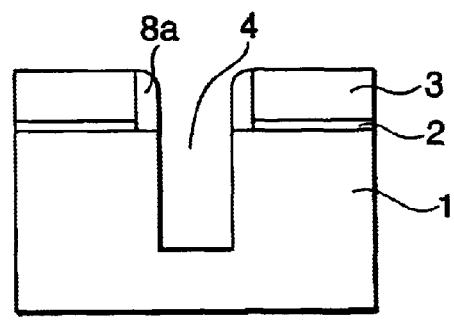
Figure 5D:
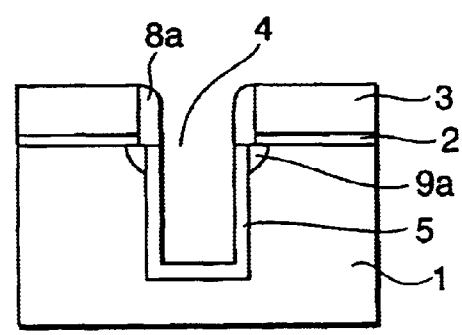
Figure 5E:
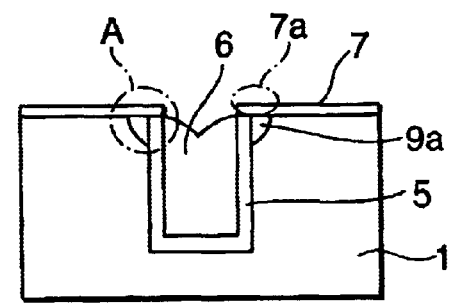
Figure 6A:
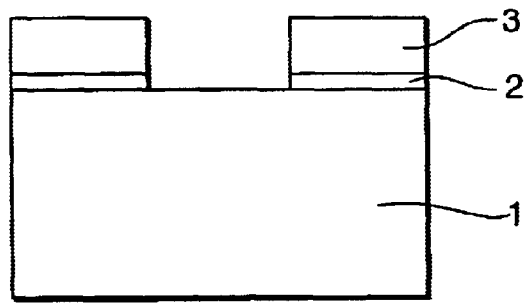
FIGS. 6(a)–(d) show an example of a conventional manufacturing method.
Figure 6B:
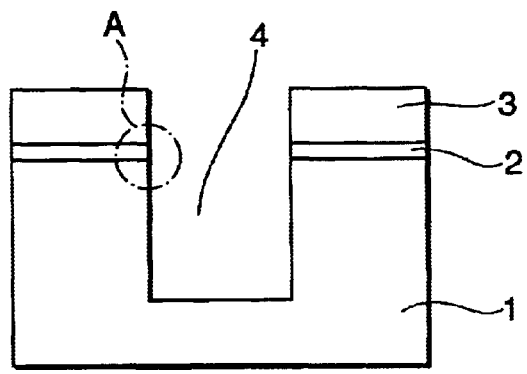
Figure 6C:
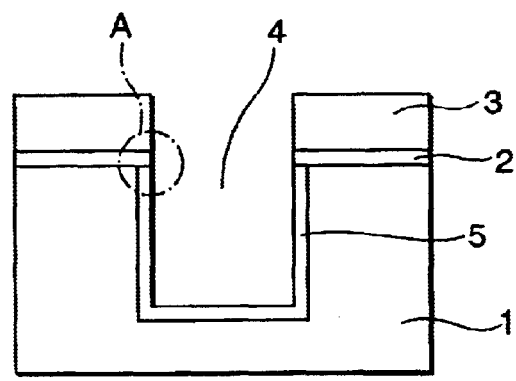
Figure 6D:
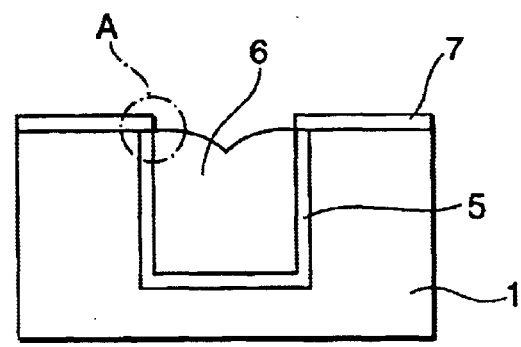

FIG. 3 is a plan view of substrate shown in FIG. 1(d), and FIG. 4 is a sectional view taken on line B—B shown in FIG. 3.

As mentioned above, after forming an isolating region of elements, as shown in FIG. 4, a gate electrode 11 is formed on the gate oxide film 7. And, succeedingly, an impurity is introduced using the gate electrode 11 as a mask. Then, a source region 12 and a drain region 13 are formed. Thus, a MOS transistor 10 is formed.

<Function of Embodiment 1>

Fluorine atoms included in silicon have the following function. The specific inductive capacity of silicon oxide film is usually about 3.9. However, it becomes about 3.7 if fluorine atoms are included at 5 atm %, for example. And, it becomes about 3.5 if fluorine atoms are included at 10 atm %, for example. When the specific inductive capacity is reduced in this way, the electric field is relived at the portions where it is reduced. Therefore, the concentration of electric field is a voided. That is, so to speak, the thickness of film is electrically made thick at t he portions including fluorine atoms, though the actual material thickness is the same. That is, the electrical thickness is thicker than the material thickness by about 5% if 5 atm % of fluorine atoms are included. And, it i s about 10% if 10 atm % of them are included. Moreover, deterioration of the quality of the films when fluorine atoms are introduced does not occur.

Thus, deterioration of the characteristic of a semiconductor element caused by the concentration of electric field, with an abrupt increase of curvature at trench corner portions A, or the concentration of electric field with progressive thinning of the film, is relieved. And, causing parasitic transistors is avoided.

Moreover, mechanical stress is likely to concentrate on the trench corner portions A. Then, surface state occurs thereon. So, positive holes are likely to be trapped thereon. As a result, f or example, the power of the element decreases. And, the characteristic of the device is badly influenced by this. It has been understood that fluorine atoms included at trench corner portions A suppress this mechanical stress.

<Effect of Embodiment 1>

As mentioned above, according to Embodiment 1, the oxide film at trench corner portions A can be made thicker electrically without using an expensive manufacturing apparatus. Because the SiOF film is formed after patterning a masking material for forming the trench, fluorine atoms are diffused from this SiOF film only into the trench corner portions A, and afterward an oxide film including fluorine atoms only at the trench corner portions A is formed by heat-oxidation. By this effect, the concentration of the electric field at the trench corner portions A can be suppressed. Besides, causing surface state or trapping of positive holes can be suppressed. Moreover, a thermal oxide film formed on the inner side walls of the trench can be made thinner corresponding to the thinning of elements. And, an increase of the difference of interface position caused by the transformation from silicon to silicon oxide with heat-oxidation can be suppressed. By this effect, the progression of oxidation into active regions where miniaturized elements are formed is suppressed. As a result, a high yield can be preserved. Besides, reliability of the gate insulating film can be enhanced. Thus, a device of high quality can be provided.

Moreover, according to Embodiment 1, ion implantation is never used when fluorine atoms are introduced. So damage to the substrate and pollution of the metal does not occur. Meanwhile, it is necessary to prevent fluorine ions from invading into regions where transistors are formed so as not to deteriorate the characteristic of the transistors. So it is necessary to make the thickness of the mask sufficiently thick. However, it is sufficient at 10 nm.

On the other hand, according to Embodiment 1, including fluorine atoms vainly all over the in side of the trench is avoided, because fluorine atoms can be included only at the trench corner portions A. By this effect, the threat of diffusing a fluorine impurity into a transistor forming region vanishes. Thus, the merit of present invention is that fluorine atoms are included effectively only at portions where electric field concentration occurs.

<Embodiment 2>

FIGS. 5(*a*)–(*d*) show principal manufacturing processes in a method of manufacturing semiconductor device according to the present invention.

In FIG. 5(*a*), at first, a silicon oxide film 2 is formed at 5 to 50 nm on a substrate 1 as a basement by CVD or heat-oxidation. And, thereon, a silicon nitride film 3 is formed by CVD. After that, patterning is performed on this silicon nitride film 3 and the silicon oxide film beneath it by photo-lithography and etching.

And, on the substrate 1 patterned like this, an oxide film including fluorine 8 comprising SiOF is formed at 50 to 200 nm by plasma CVD. The processes mentioned above are performed as the same as in Embodiment 1.

In FIG. 5(*b*), succeeding to the processes mentioned above, some portions of the oxide film including fluorine 8 are removed so as to form side walls 8*a*. This is performed by known an-isotropic etching, removing them by the etching only in the vertical direction in the drawing. Then, a trench opening is formed between these side walls 8*a*. Therefore, as for the opening formed by patterning to the silicon nitride film 3 and silicon oxide film 2, its width is the trench opening's width plus both widths of the side walls 8*a*. So, the patterning mentioned above is performed at this width. Moreover, the trench opening's width is adjusted in detail by adjusting the thickness of the oxide film including fluorine 8 in a range of 50 to 200 nm.

In FIG. 5(*c*), a trench 4 is formed in an isolating region for an element in substrate 1 by known etching, using the silicon oxide film 2, silicon nitride film 3 and side walls 8*a* as a mask.

In FIG. 5(*d*), a thermal oxide film 5 is formed at a thickness of 5 to 15 nm by performing heat-oxidation at a temperature of 900 to 1100° C. This is what is performed for gentling corner portions A of trench 4. During this heat-oxidation, at the portions of substrate 1 which face the side walls 8*a*, fluorine atoms diffuse from side walls 8*a* by heat-diffusion. Thus, more fluorine is included in the more upper portions of thermal oxide film 5. Fluorine containing silicon layer portions 9*a* are thus formed in the vicinity of the side walls 8*a* of the substrate 1.

In FIG. 5(*e*), an oxide film 6 is formed by CVD. Then, it is filled by CMP. And, the silicon nitride film 3 and silicon oxide film 2 are removed.

After that, gate oxide film 7 is formed by heat-oxidation or CVD. The gate oxide film 7 formed in this way has fluorine containing oxide layer portions 7*a* in the vicinity of fluorine containing silicon layer portions 9*a* by heat-diffusion with heat-oxidation or annealing.

As mentioned above, a silicon oxide film including only in the vicinity of trench corner portions A, is formed.

This is almost same as the silicon oxide film formed by the manufacturing method of Embodiment 1. And, the function of it is same as the function described in Embodiment 1.

Moreover, as mentioned above, after forming an isolating region of elements, as shown in FIG. 4, a gate electrode 11 is formed on the gate oxide film 7. And, succeedingly, an impurity is introduced using the gate electrode 11 as a mask. Then, a source region 12 and a drain region 13 are formed. Thus, a MOS transistor 10 is formed.

<Effect of Embodiment 2>

As mentioned above, according to Embodiment 2, a fluorine diffusing layer can be easily obtained without forming a fluorine diffusing layer 9, which is different from Embodiment 1, because side walls 8a comprising SiOF film are formed after patterning a masking material for forming the trench, fluorine atoms are diffused from this SiOF film only into trench corner portions A, and an oxide film including fluorine atoms only at the trench corner portions A is formed by heat-oxidation performed after that. Moreover, fluorine atoms can be easily diffused, even if the width of the trench opening becomes narrow as high integration and thinning of film proceed. As a result, the oxide film at the trench corner portions A can be made thicker electrically without using an expensive manufacturing apparatus. By this effect, the concentration of electric field at trench corner portions A can be depressed. Besides, causing surface state or trapping of positive holes can be suppressed. Moreover, the thermal oxide film formed on the inner side walls of the trench can be made thinner corresponding to thinning of elements. An, increase of the difference of interface position caused by the transformation from silicon to silicon oxide with heat-oxidation can be suppressed. By this effect, the progression of oxidation into active regions where miniaturized elements are formed is suppressed. As a result, a high yield can be preserved. Besides, the reliability of the gate insulating film can be enhanced. Thus, a device of high quality can be provided.

Moreover, according to Embodiment 2, similar to Embodiment 1, ion implantation is never used when fluorine atoms are introduced, so, damage to the substrate and pollution of metal the do not occur. And, the thickness of mask to prevent fluorine ions from invading into regions where transistors are formed is sufficient at 10 nm.

On the other hand, according to Embodiment 2, similarly as Embodiment 1, including fluorine atoms vainly all over in trench, is avoided, because fluorine atoms can be included only at the trench corner portions A. By this effect, a threat of diffusing fluorine impurity into transistor forming region, is vanished. Thus, in Embodiment 2 similarly as Embodiment 1, the merit is that fluorine atoms are included effectively only at portions where electric field concentration occurs.

<Other Embodiment>

In each Embodiment mentioned above, an oxide film including fluorine atoms is formed as an SiOF film by CVD. This film is used as a source of diffusing fluorine atoms. However, the present invention is not limited to this. A non-doped oxide film not including fluorine atoms can be formed by CVD. And, after that, fluorine atoms can be introduced into this CVD film by ion implantation.

What is claimed is:

1. A method of manufacturing a semiconductor device, comprising:

preparing a semiconductor substrate having at least one region to form an isolating layer for an element on a main surface of the substrate;

forming an oxide film including fluorine on the main surface at the region to form an isolating layer for an element;

forming a fluorine atoms diffusing region in the substrate corresponding to a peripheral portion of the region to form an isolating layer for an element by diffusing fluorine atoms from the oxide film including fluorine to the substrate;

forming a trench in the main surface corresponding to the region to form an isolating layer for an element so as to leave the fluorine atoms diffusing region at a peripheral portion of the trench; and forming an isolating layer for an element by selectively filling the trench with oxide film.

2. The method of claim 1, wherein said forming a fluorine atoms diffusing region comprises forming the region so as to be wider than the width of the isolating layer for an element.

3. The method of claim 1, wherein the size of a remaining portion of the fluorine atoms diffusing region, after said forming a trench, is determined so as to be operable to relieve electric field concentration at an end of the isolating layer for an element.

4. The method of claim 1, wherein said forming an oxide film including fluorine is carried out by plasma CVD.

5. A method of manufacturing a semiconductor device, comprising:

forming a silicon oxide film on a substrate;

forming a silicon nitride film on the silicon oxide film;

forming a trench opening by patterning the silicon nitride film and the silicon oxide film;

forming an oxide film including fluorine on the substrate at the trench opening;

forming a fluorine diffusing layer by diffusing fluorine from the oxide film including fluorine by heat diffusion;

removing the oxide film including fluorine;

forming a trench using the silicon nitride film and the silicon oxide film as a mask;

forming a thermal oxide film on an inner wall of the trench;

filling the trench with oxide film; and forming an isolating region for an element by removing the silicon nitride film and the silicon oxide film.

6. The method of claim 5, and further comprising:

forming a gate oxide film by heat oxidation;

forming a gate electrode; and forming a source region and a drain region.

7. The method of claim 5, further comprising:

forming a gate oxide film by chemical vapor deposition;

annealing the gate oxide film;

forming a gate electrode; and forming a source region and a drain region.

8. The method of claim 5, wherein the thermal oxide film formed on the inner wall of the trench is not more than 30 nm thick.

9. The method of claim 5, wherein said forming an oxide film including fluorine is carried out by plasma CVD.

10. A method of manufacturing a semiconductor device comprising:

forming a silicon oxide film on a substrate;

forming a silicon nitride film on the silicon oxide film;

forming a trench opening by patterning the silicon nitride film and the silicon oxide film;

forming an oxide film including fluorine on the substrate where the trench opening is formed;

forming a side wall by etching the oxide film including fluorine;

forming a trench using the side wall, the silicon nitride film and the silicon oxide film as a mask;

forming a thermal oxide film on an inner wall of the trench and forming fluorine containing silicon layer portions at a side of the substrate by diffusing fluorine atoms from the side wall to the substrate by heat diffusion;

filling the trench with oxide film; and forming an isolating region for an element by removing the silicon nitride film and the silicon oxide film.

11. The method of claim 10, and further comprising:

forming a gate oxide film by heat oxidation;

forming a gate electrode; and forming a source region and a drain region.

12. The method of claim 10, further comprising:

forming a gate oxide film by chemical vapor deposition;

annealing the gate oxide film;

forming a gate electrode; and forming a source region and a drain region.

13. The method of claim 10, wherein the thermal oxide film formed on the inner wall of the trench is not more than 30 nm thick.

14. The method of claim 10, wherein said forming an oxide film including fluorine is carried out by plasma CVD.

* * * * *